(12) United States Patent
Kondo

(10) Patent No.: US 11,765,876 B2
(45) Date of Patent: Sep. 19, 2023

(54) EXCHANGE DEVICE

(71) Applicant: FUJI CORPORATION, Chiryu (JP)

(72) Inventor: Masahiro Kondo, Kasugai (JP)

(73) Assignee: FUJI CORPORATION, Chiryu (JP)

( * ) Notice: Subject to any disclaimer, the term of this patent is extended or adjusted under 35 U.S.C. 154(b) by 391 days.

(21) Appl. No.: 17/251,403

(22) PCT Filed: Jun. 12, 2018

(86) PCT No.: PCT/JP2018/022364
§ 371 (c)(1),
(2) Date: Dec. 11, 2020

(87) PCT Pub. No.: WO2019/239475
PCT Pub. Date: Dec. 19, 2019

(65) Prior Publication Data
US 2021/0251113 A1    Aug. 12, 2021

(51) Int. Cl.
*B23P 19/00* (2006.01)
*H05K 13/04* (2006.01)

(52) U.S. Cl.
CPC ..... *H05K 13/0486* (2013.01); *H05K 13/0417* (2013.01)

(58) Field of Classification Search
CPC ............. H25K 13/021; H25K 13/0417; H25K 13/0486; H25K 13/086
See application file for complete search history.

(56) References Cited

U.S. PATENT DOCUMENTS 10,117,368 B2 * 10/2018 Mizuno ............. H05K 13/0061
10,959,360 B2 *  3/2021 Kondo ................... H05K 13/08
(Continued)

FOREIGN PATENT DOCUMENTS

JP      3-129899 A     6/1991
JP   2017-27996 A     2/2017
(Continued)

OTHER PUBLICATIONS

International Search Report dated Aug. 21, 2018 in PCT/JP2018/022364 filed on Jun. 12, 2018, 2 pages

*Primary Examiner* — Paul D Kim
(74) *Attorney, Agent, or Firm* — Oblon, McClelland, Maier & Neustadt, L.L.P.

(57) ABSTRACT

An exchange device to exchange an exchangeable element includes an arrangement directional moving section to move with respect to the component mounting device in the arrangement direction; multiple attachment/detachment directional moving sections provided in the arrangement directional moving section to move independently of each other in the attachment/detachment direction of the exchangeable element; at least one holding section provided in each of the multiple attachment/detachment directional moving sections to hold the exchangeable element; an arrangement direction driving device to move the arrangement directional moving section in the arrangement direction; and an attachment/detachment direction driving device to move multiple attachment/detachment directional moving sections, independently of each other, in the attachment/detachment direction.

12 Claims, 10 Drawing Sheets

(56) References Cited

U.S. PATENT DOCUMENTS

2020/0275589 A1* 8/2020 Ishikawa ............ H05K 13/0411
2022/0347848 A1* 11/2022 Nakayama ......... H05K 13/0882

FOREIGN PATENT DOCUMENTS

| WO | WO 2014/118995 A1 | 8/2014 |
| WO | WO 2017/033268 A1 | 3/2017 |
| WO | WO 2018/092249 A1 | 5/2018 |

* cited by examiner

EXCHANGE DEVICE

TECHNICAL FIELD

The present description relates to an exchange device for automatically exchanging an exchangeable element detachably installed in a component mounting device.

BACKGROUND ART

Technology for mass producing circuit boards by applying board work to boards on which wiring is printed is widespread. Board work devices for performing board work include a component mounting device for performing component mounting work. As a typical example of a component supply device provided in a component mounting device, there is a tape feeder for supplying components using a carrier tape. In recent years, in order to save labor in supplying components, technology for automatically exchanging tape feeders or automatically exchanging tape reels on which carrier tapes are wound have been developed. Technological examples relating to this type of exchange device are disclosed in Patent Literature 1 and 2.

Patent Literature 1 discloses a cassette-type feeder exchange system of a component mounting device including a suction work area in which multiple cassette-type feeders are arranged and set, a feeder stocking area in which pre-use and used cassette-type feeders are accommodated, and a replacement robot configured to exchange cassette-type feeders between the suction work area and the feeder stocking area. With this configuration, it is possible to automate the work of exchanging the cassette-type feeder, and moreover, it is possible to smoothly exchange cassette-type feeders between areas.

Further, Patent Literature 2 discloses a component mounting line including a unit storage container for storing multiple component supply units, a unit exchange device for exchanging component supply units attached to multiple component mounting devices and component supply units stored in the unit storage container, and a control device for controlling the unit exchange device. With this configuration, the unit storage container can convey a component supply unit in and out during replenishment and collection, and user-friendliness is improved regardless of the component mounting device the component supply unit is used in.

PATENT LITERATURE

Patent Literature 1: WO 2014/118995
Patent Literature 2: WO 2017/033268

BRIEF SUMMARY

Technical Problem

In the technological examples of exchange devices in Patent Literature 1 and 2, the exchangeable elements (i.e., cassette-type feeders, component supply units) of the component mounting device are exchanged one by one. For example, in Patent Literature 1, a cassette-type feeder whose components have been consumed by mounting work is collected from a suction work area, transferred, and stored in a feeder stocking area, and thereafter, a new cassette-type feeder is pulled out of the feeder stocking area, transferred and set in the suction work area. During the exchange operation, the mounting work is interrupted, and non-production time passes during which boards cannot be produced.

Further, in many cases of setup changing work for changing the type of board to be produced, it is necessary to exchange multiple exchangeable elements of a component mounting device, thereby prolonging the non-production time. There is a strong demand to shorten such non-production time and improve the efficiency of board production.

It is an object of the present disclosure to provide an exchange device capable of reducing the non-production time of a component mounting device and improving the efficiency of board production.

Solution to Problem

The present description discloses an exchange device configured to exchange an exchangeable element detachably installed in a component supply section of a component mounting device, the component supply section in which the exchangeable elements, each of which include at least a component container accommodating multiple components, are arranged in an arrangement direction, the exchange device comprising: an arrangement directional moving section configured to move with respect to the component mounting device in the arrangement direction; multiple attachment/detachment directional moving sections provided in the arrangement directional moving section and configured to move independently of each other in the attachment/detachment direction of the exchangeable element; at least one holding section provided in each of the multiple attachment/detachment directional moving sections and configured to hold the exchangeable element; an arrangement direction driving device configured to move the arrangement directional moving section in the arrangement direction; and an attachment/detachment direction driving device configured to move multiple attachment/detachment directional moving sections, independently of each other, in the attachment/detachment direction.

Further, the present specification discloses an exchange device configured to exchange an exchangeable element detachably installed in a component supply section of a component mounting device, the component supply section in which exchangeable elements, each of which include at least a component container accommodating multiple components, are arranged in an arrangement direction at a predetermined pitch or an integer multiple of the predetermined pitch, the exchange device comprising: an arrangement directional moving section configured to move with respect to the component mounting device in the arrangement direction; an attachment/detachment directional moving section provided in the arrangement directional moving section and configured to move in the attachment/detachment direction of the exchangeable element; multiple holding sections provided adjacent to each other in the attachment/detachment directional moving section in the arrangement direction at the predetermined pitch or an integer multiple of the predetermined pitch and configured to hold the exchangeable element; an arrangement direction driving device configured to move the arrangement directional moving section in the arrangement direction; and an attachment/detachment direction driving device configured to move the attachment/detachment directional moving section in the attachment/detachment direction.

Advantageous Effects

Since the exchange device disclosed herein includes multiple holding sections, multiple exchangeable elements can be handled at the same time. Therefore, as compared with the conventional configuration having only one holding section, the non-production time required for exchanging the exchangeable element is shortened, the percentage of production time of the component mounting device is increased, and the efficiency of board production is improved.

DESCRIPTION OF EMBODIMENTS

Figure 1:
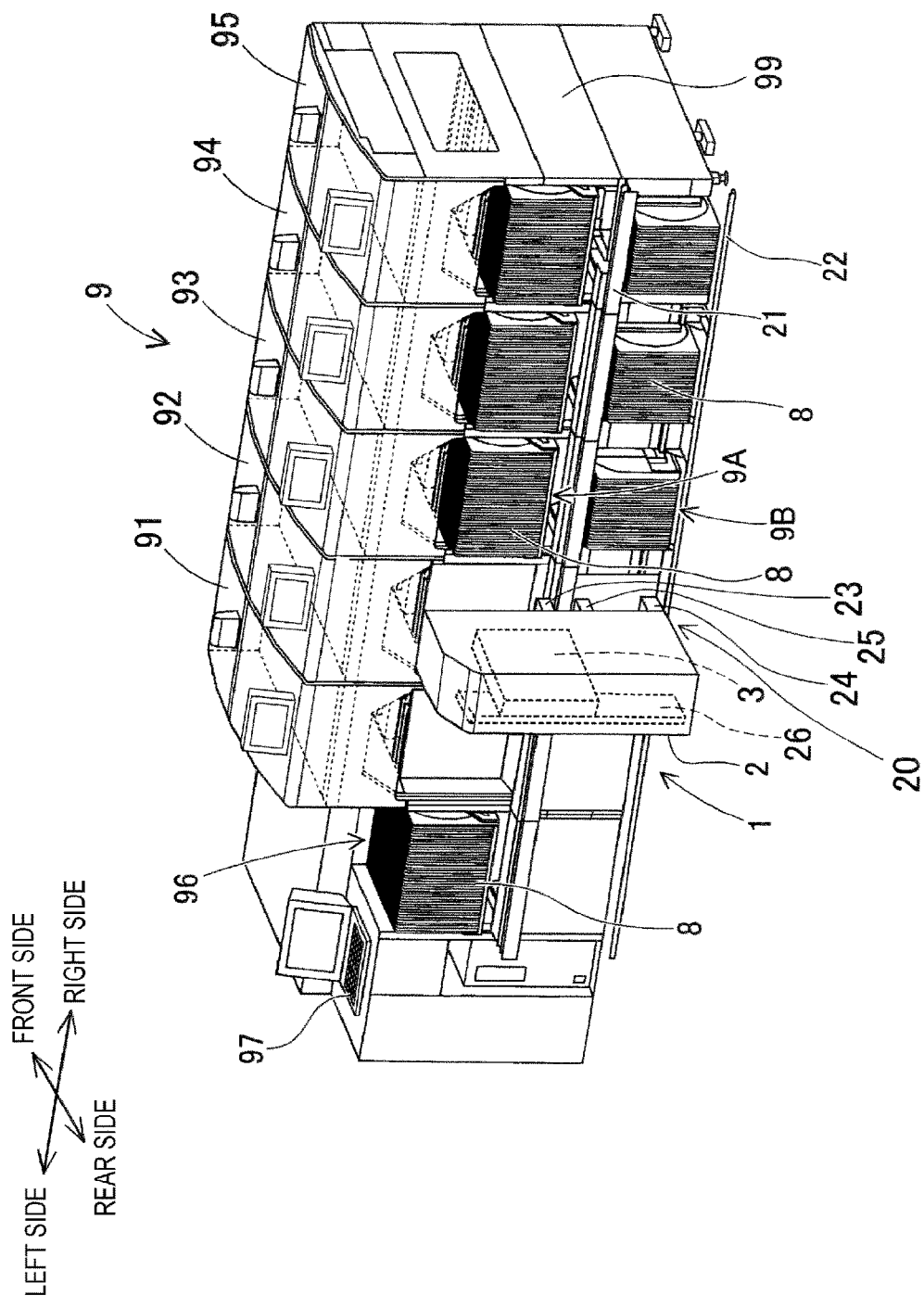
FIG. 1 is a perspective view showing a configuration example of a component mounting system in which an exchange device of the embodiment is applied.

1. Configuration of Component Mounting System 9 in which Exchange Device 1 of the Embodiment is Applied First, a configuration example of component mounting system 9, which is the application portion of exchange device 1 of the embodiment, will be described. FIG. 1 is a perspective view showing a configuration example of component mounting system 9 in which exchange device 1 of the embodiment is applied. The front, rear, left, and right of the component mounting system 9 will be defined as shown in FIG. 1 for convenience. Component mounting system 9 is configured by arranging multiple board work devices in the left-right direction. That is, solder printing device 91, print inspection device 92, first component mounting device 93, second component mounting device 94, third component mounting device 95, a board appearance inspection device (not shown), and a reflow device (not shown) are arranged in a row from the left side to the right side.

Each board work device performs a predetermined operation on a board, that is, a board operation. Specifically, solder printing device 91 prints paste-like solder on a board in a defined pattern shape. Print inspection device 92 images and inspects the solder printing state of a board. First component mounting device 93, second component mounting device 94, and third component mounting device 95 picks up components from component supply section 9A and mount the components on the solder of a board. The board appearance inspection device images components mounted on the board and inspects the appearance. The reflow device ensures soldering of components by heating and cooling the solder. Board work is not limited to the above-described work content and includes accompanying work and the like. For example, board convey-in/out operations, positioning operations, and checking operations, for determining positions and orientations of boards and components by imaging boards and components, are also included in board work.

First component mounting device 93, second component mounting device 94, and third component mounting device 95 have the same structure. Component mounting devices 93, 94, 95 each include component supply section 9A, spare feeder storage section 9B, a board conveyance device not visible in FIG. 1, and a component transfer device.

Component supply section 9A is disposed at an intermediate height of the front side of device table 99. Component supply section 9A has multiple slots extending in the front-rear direction and formed parallel with each other at predetermined pitch Ps (see FIGS. 5 to 7). Tape feeder 8 is inserted into each slot of component supply section 9A. That is, multiple tape feeders 8 are arranged side by side in the left-right direction of FIG. 1.

Tape feeder 8 is a component supply device detachably installed in component supply section 9A and serves as an exchangeable element. In addition, the left-right direction in FIG. 1 is the arrangement direction of the exchangeable element (hereinafter, simply referred to as the arrangement direction), and the front-rear direction in FIG. 1 is the attachment/detachment direction of the exchangeable element (hereinafter, simply referred to as the attachment/detachment direction). Tape feeder 8 is used interchangeably in first component mounting device 93, second component mounting device 94, and third component mounting device 95.

Spare feeder storage section 9B is disposed below component supply section 9A on the front side of device table 99. Spare feeder storage section 9B also has multiple slots extending in the front-rear direction and formed parallel to each other at predetermined pitch Ps. In the slots of spare feeder storage section 9B, spare tape feeders 8 ready for use and used tape feeders 8 are arranged and temporarily stored. The board conveyance device carries in, positions, and carries out boards. The component transfer device picks up a component from component supply section 9A using a component mounting tool, such as a suction nozzle, and mounts the component on a board.

Further, component mounting system 9 is provided with feeder storage device 96, line management device 97, and exchange device 1 of the embodiment. Feeder storage device 96 is disposed adjacent to the left side of solder printing device 91 and at the same height as component supply section 9A of component mounting devices 93,94,95. Feeder storage device 96 also has multiple slots extending in the front-rear direction and formed parallel to each other at predetermined pitch Ps. Also in the slots of feeder storage device 96, tape feeders 8 ready for use and used tape feeders 8 are arranged and stored.

Line management device 97 is disposed adjacent to the left side of feeder storage device 96. Line management device 97 is connected in communication with multiple board work devices. Line management device 97 manages job data describing work contents of board operations which are different for each board type. Line management device 97 transmits job data to multiple board work devices based on a production plan. Line management device 97 further monitors operation states of multiple board work devices.

2. Structure of Tape Feeder 8

Figure 2:
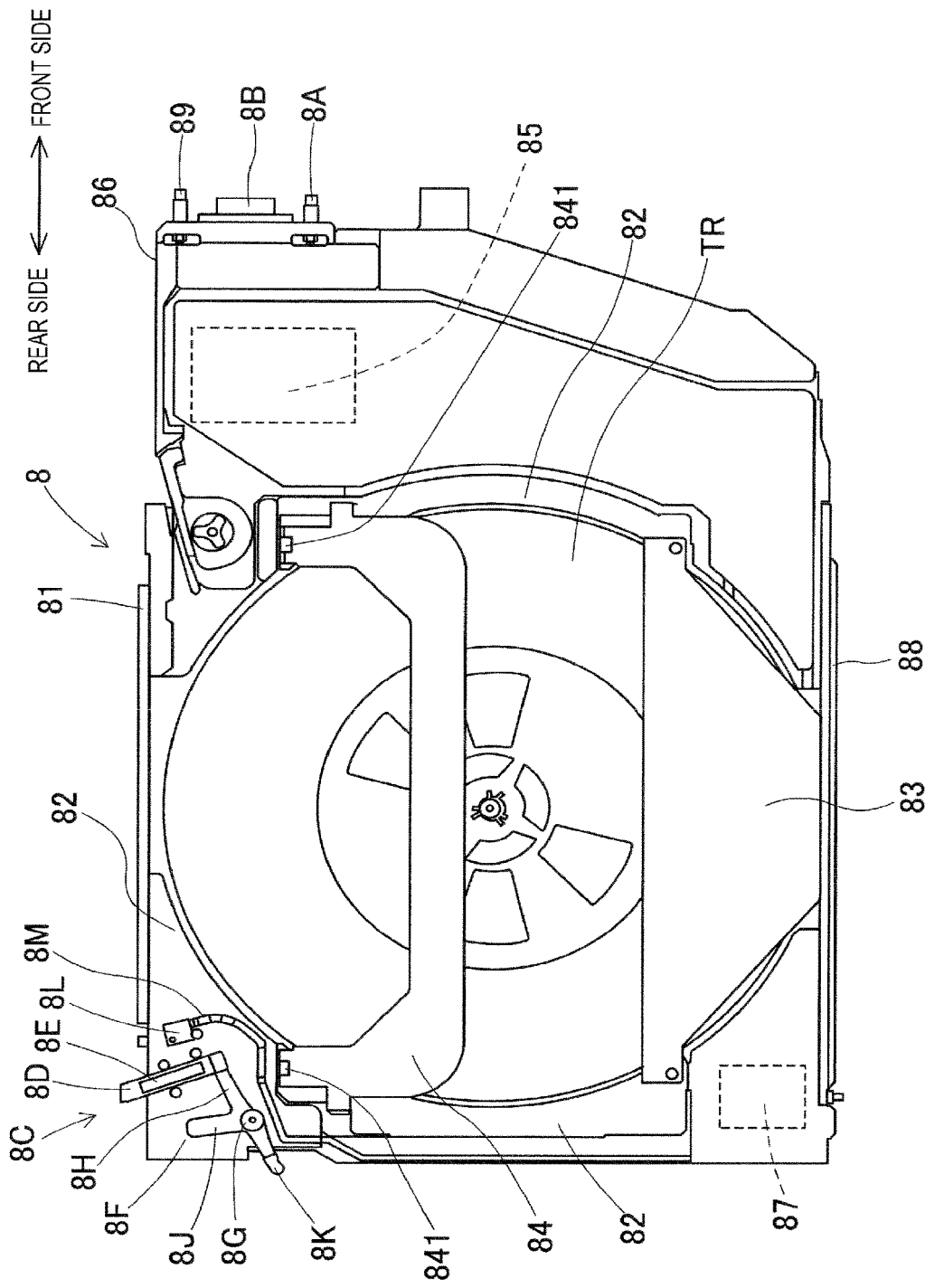
FIG. 2 is a side view of a tape feeder serving as an exchangeable element.

Next, the structure of tape feeder 8 will be described. FIG. 2 is a side view of tape feeder 8 which serves as an exchangeable element. Tape feeder 8 is configured to be thin in the width direction by assembling various members to a frame body 81 including a side plate. Tape feeder 8 includes frame body 81, reel accommodation frame 82, accommodation plate 83, open/close plate 84, tape feeding section 85, component supply position 86, feeder control section 87, protruding strip 88, upper positioning pin 89, lower positioning pin 8A, connector 8B, lock section 8C, and the like.

Reel accommodation frame 82 is a multiple of frame members that form a large circular internal space substantially at the center of frame body 81. Reel accommodation frame 82 accommodates tape reel TR in an internal space so that tape reel TR can freely rotate. Accommodation plate 83 is attached to the lower portion of reel accommodation frame 82. The separation distance between accommodation plate 83 and the side plate of frame body 81 is set slightly larger than the thickness of tape reel TR. Accommodation plate 83 prevents tape reel TR from becoming detached.

Open/close plate 84 is attached above the intermediate height of reel accommodation frame 82. The separation distance between open/close plate 84 and the side plate of frame 81 is also set slightly larger than the thickness of tape reel TR. In addition, open/close plate 84 is configured such that two front and rear upper portions 841 are supported by frame body 81 and open upward. By opening open/close plate 84, tape reel TR can be exchanged. A carrier tape, in which multiple components are stored, is wound around tape reel TR. Tape reel TR serves as a component container for accommodating multiple components.

Tape feeding section 85 is disposed at the front upper portion of frame body 81. Tape feeding section 85 draws out the carrier tape from tape reel TR and feeds the carrier tape to component supply position 86 provided at the front of the top face of frame body 81. Tape feeding section 85 is composed of a sprocket having teeth that fit into the feeding holes of the carrier tape, a motor that drives the sprocket in a rotational manner, and the like.

Feeder control section 87 is disposed at the rear lower portion of frame body 81. Feeder control section 87 controls tape feeding section 85 and monitors the state of lock section 8C. Feeder control section 87 is connected in communication with the control device on the main body side of component mounting device 93,94,95 via connector 8B.

Protruding strip 88 is provided on the bottom face of frame body 81. Protruding strip 88 is inserted into any of the slots of component supply section 9A, spare feeder storage section 9B, and feeder storage device 96. Protruding strip 88 is also inserted into slot 314 of case 31 of exchange section 3 of exchange device 1, which will be described later. As a result, protruding strip 88 is guided by slot 314 at the time of exchanging, and tape feeder 8 moves from exchange device 1 to component supply section 9A or the like or moves in the reverse direction.

Upper positioning pin 89 and lower positioning pin 8A are provided at the upper portion of the front face of frame body 81 so as to be separated from each other in the up-down direction. Upper positioning pin 89 and lower positioning pin 8A fit into the positioning holes of component supply section 9A to position tape feeder 8. Connector 8B is disposed between upper positioning pin 89 and lower positioning pin 8A. Connector 8B is responsible for supplying power and providing a communication connection to tape feeder 8. When tape feeder 8 is positioned, connector 8B automatically fits into the receiving side connector of component supply section 9A.

Figure 3:
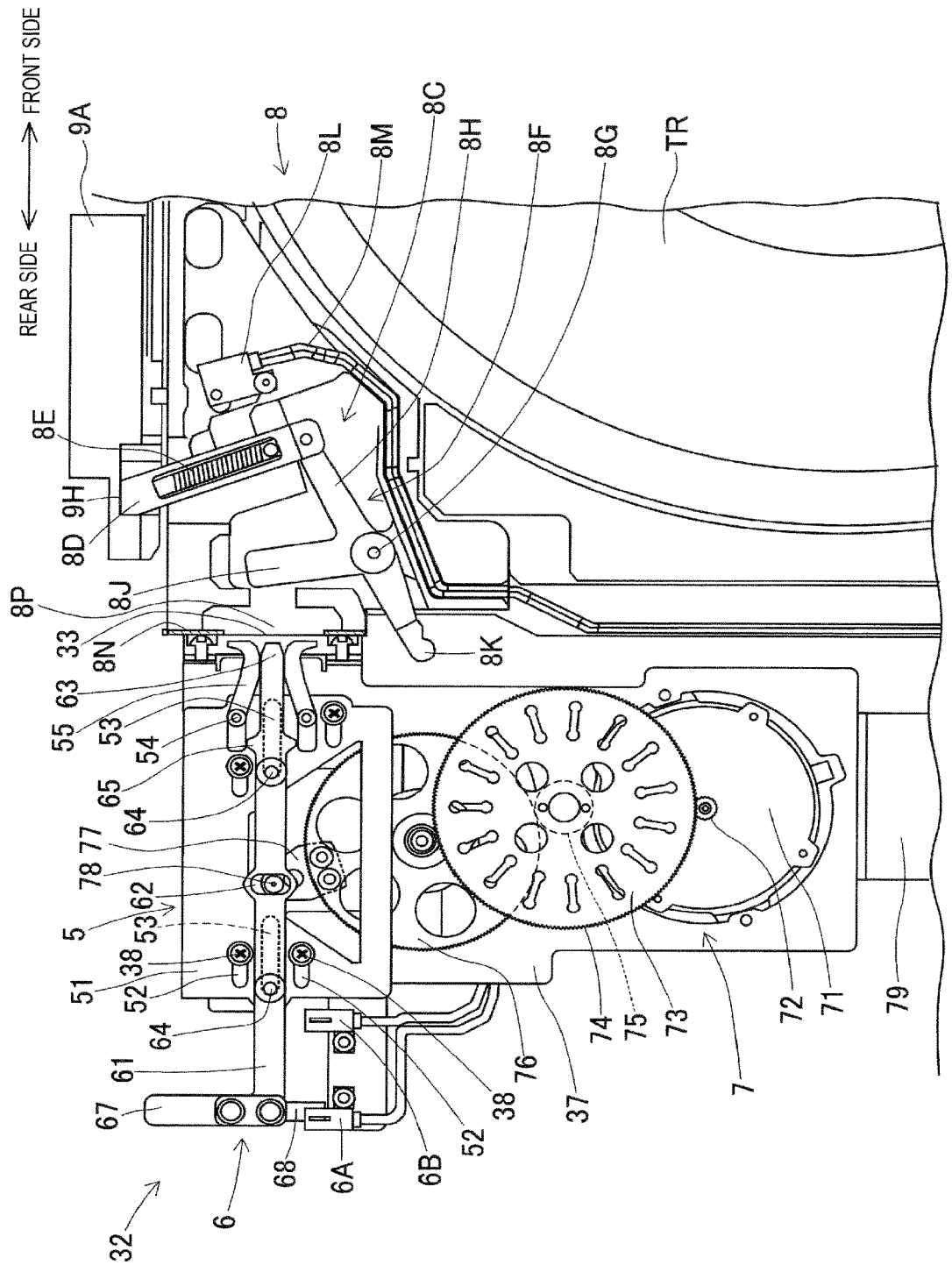
FIG. 3 is a side view showing a configuration in the vicinity of a lock section of the tape feeder and the internal configuration of an attachment/detachment directional moving section.

Lock section 8C is disposed at the rear upper portion of frame body 81. FIG. 3 is a side view showing a configuration of the lock section vicinity of lock section 8C of tape feeder 8 and the internal configuration of attachment/detachment directional moving section 32 of exchange device 1, which will be described later. Lock section 8C includes lock pin 8D, lock spring 8E, lock operation member 8F, lock sensor 8L, and the like. Lock pin 8D is a tubular member and is held by frame body 81 in a manner which allows vertical movement. Lock spring 8E has a coil shape and is arranged inside lock pin 8D. One end of lock spring 8E is coupled to frame body 81, and the other end thereof is coupled to lock pin 8D.

Lock spring 8E biases lock pin 8D upward. In tape feeder 8 installed in component supply section 9A, lock pin 8D lifted up by the biasing protrudes from the top face of frame body 81 and fits into lock hole 9H of component supply section 9A. As a result, lock section 8C is brought into a locked state, and tape feeder 8 is prevented from coming out or rattling.

Lock operation member 8F is a Y-shaped member having swing fulcrum 8G. Swing fulcrum 8G is supported by frame body 81 in a manner which allows swinging. Operation arm 8H extending forward from swing fulcrum 8G engages with the lower end of lock pin 8D. Release arm 8J extending upward from swing fulcrum 8G is pushed forward by direct operation member 61 described later. Manual arm 8K extending rearward from swing fulcrum 8G protrudes from the rear face of frame body 81. Manual arm 8K is pushed upward by the operation of an operator.

Figure 8:
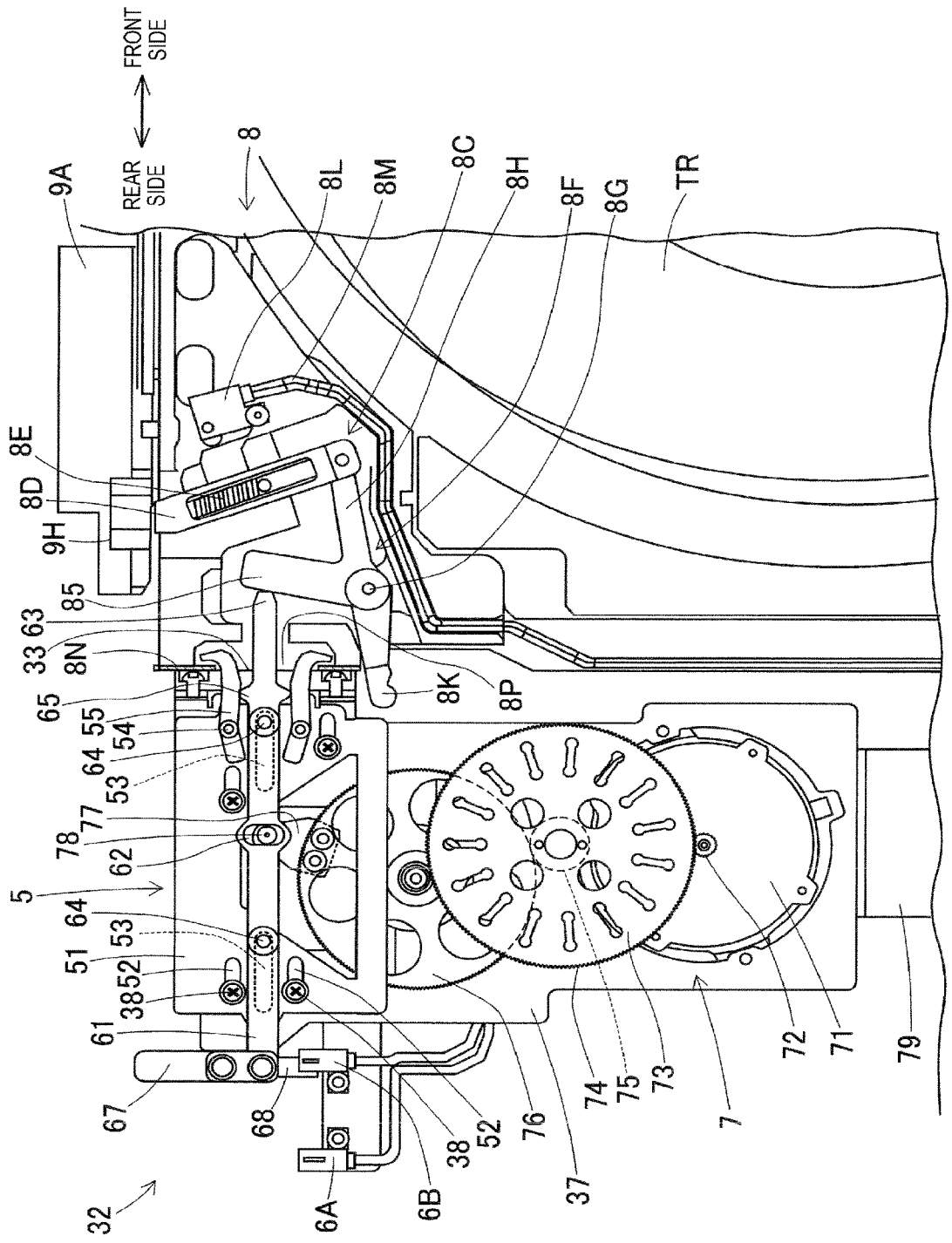
FIG. 8 is a side view of attachment/detachment directional moving section showing a holding state in which a holding section and a release section have operated.

When release arm 8J or manual arm 8K is pushed and moved, lock operation member 8F swings clockwise in FIG. 3 about swing fulcrum 8G. When this occurs, operation arm 8H lowers lock pin 8D against the force of lock spring 8E. Lock pin 8D then escapes from lock hole 9H. As a result, lock section 8C shifts from a locked state to a released state, as shown in FIG. 8. In addition, tape feeder 8 is in a state in which it is possible to draw out tape feeder 8 from the slot.

Lock sensor 8L detects the state of lock section 8C, that is, whether lock section 8C is in the locked state or the released state. Lock sensor 8L outputs the detection result to feeder control section 87 via output cable 8M. In tape feeder 8 installed in component supply section 9A, feeder control section 87 does not proceed with the supplying of components when lock section 8C is in the released state. The reason is that it is determined that tape feeder 8 is not in a good installation orientation.

Further, as shown in FIG. 3, holding plate 8N is provided in the vertical direction on the rear side of lock section 8C. Holding plate 8N is a part held by holding section 5. Holding plate 8N has holding hole 8P at its center. Holding hole 8P is positioned at the same height as that of connector 8B. When viewed from the rear, release arm 8J of lock operation member 8F is positioned on the extension line of holding hole 8P.

Multiple types of tape feeders 8 with different widths in the arrangement direction are prepared for handling tape reels TR of multiple thicknesses. Standard tape feeder 8X has a width of predetermined pitch Ps or less and is provided side by side in adjacent slots. In other words, standard tape feeder 8X is arranged in the arrangement direction at predetermined pitch Ps (refer to FIG. 6).

Large tape feeder 8Y whose width exceeds predetermined pitch Ps and is twice predetermined pitch Ps or less occupies and is installed in two slots. In other words, large tape feeder 8Y is arranged in the arrangement direction at a pitch that is twice predetermined pitch Ps (refer to FIG. 6). Furthermore, very large tape feeder 8Z whose width exceeds twice predetermined pitch Ps occupied and is installed in three or more slots. In other words, very large tape feeder 8Z is arranged in the arrangement direction at a pitch of three times or more of predetermined pitch Ps (refer to FIG. 7).

3. Configuration of Exchange Device 1 of the Embodiment

Next, a description will be given of exchange device 1 of the embodiment. Exchange device 1 automatically exchanges tape feeder 8. Specifically, exchange device 1 exchanges tape feeder 8 between component supply section 9A and spare feeder storage section 9B of component mounting device 93,94,95. Further, exchange device 1 moves between component mounting devices 93,94,95 and feeder storage device 96, and conveys and exchanges tape feeder 8.

As shown in FIG. 1, exchange device 1 includes arrangement directional moving section 2, arrangement direction driving device 20, exchange section 3, and various constituent elements provided inside exchange section 3. Arrangement directional moving section 2 is provided in a manner which allows movement in the arrangement direction with respect to component mounting devices 93, 94, 95. Arrangement directional moving section 2 is an oblong box-shaped member having an open front side. Arrangement direction driving device 20 moves arrangement directional moving section 2 in the arrangement direction. Arrangement direction driving device 20 is configured with a track section provided on the non-moving side; an engaging section, engaged with the track section in a movable manner, provided on the moving side; a driving source for generating moving power; and the like.

Middle rail 21 and lower rail 22 constituting the track section are provided on the rear face of device table 99 at each of the multiple board work devices and on the rear face of feeder storage device 96. Middle rail 21 and lower rail 22 extend in the arrangement direction. The height of middle rail 21 is integrated between component supply section 9A and spare feeder storage section 9B. The height of lower rail 22 is integrated with the lower side of spare feeder storage section 9B. As a result, the multiple middle rails 21 and the multiple lower rails 22 form two tracks which are parallel to each other and continue from feeder storage device 96 to third component mounting device 95.

Middle-level traveling section 23 and lower-level traveling section 24, serving as engaging sections, are arranged on the left and right on the front side of arrangement-directional moving section 2. Middle-level traveling section 23 is engaged with middle-level rail 21 in a movable manner, and lower-level traveling section 24 is engaged with lower-level rail 22 in a movable manner. Middle-level traveling section 23 further includes a driving source for generating traveling power. As a result, arrangement directional moving section 2 attaches to middle rail 21 and lower rail 22, and travels and moves in the arrangement direction.

Furthermore, arrangement directional moving section 2 includes a non-contact power receiving section 25 at a height between middle-level traveling section 23 and lower-level traveling section 24, which is a height that does not hinder exchange of tape feeder 8. Non-contact power receiving section 25 receives power in a non-contact manner from non-contact power transmission sections provided at a corresponding height on the multiple board work devices.

Figure 4:
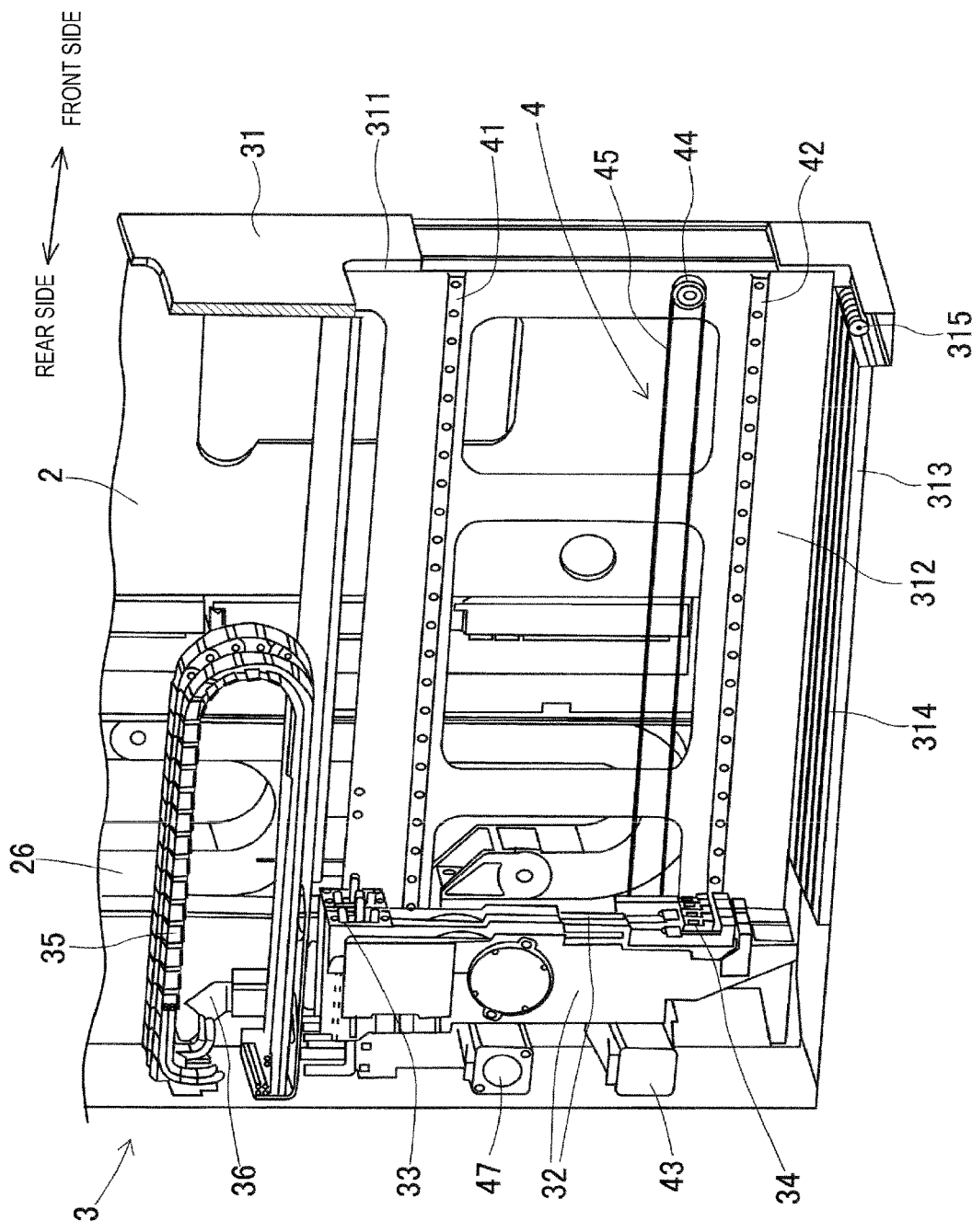
FIG. 4 is a perspective view showing an internal configuration of an exchange section.

Further, arrangement directional moving section 2 has lifting/lowering driving section 26 and exchange section 3 inside a box-shaped interior space. Lifting/lowering driving section 26 lifts and lowers exchange section 3 from the height of component supply section 9A to the height of spare feeder storage section 9B. A ball screw feed mechanism is an example of lifting/lowering driving section 26, but the present disclosure is not limited thereto. FIG. 4 is a perspective view showing the internal configuration of exchange section 3. In FIG. 4, the side plate and the like of case 31 closer to the viewer from the viewpoint of the figure, are omitted.

Exchange section 3 includes case 31, two attachment/detachment directional moving sections 32, and two attachment/detachment direction driving devices 4. Case 31 has opening 311 on the front side which four standard tape feeders 8X arranged adjacent to each other can be taken out from or put into in a lined up state. Case 31 further has an internal space in which four standard tape feeders 8X can be accommodated. Four slots 314 formed in parallel with each other at predetermined pitch Ps are engraved in bottom plate 313 of case 31. Further, guide rollers 315 are disposed in the front of each slot 314 of bottom plate 313. As a result, tape feeder 8 is ejected out or taken in by way of opening 311 and guide roller 315 while protruding strip 88 is guided by slot 314.

The two attachment/detachment directional moving sections 32 are provided in a manner which allows movement, independently of each other, in the attachment/detachment direction, with respect to arrangement directional moving section 2. The two attachment/detachment directional moving sections 32 are provided in case 31 and arranged separately in the arrangement direction. Attachment/detachment directional moving section 32 has holding face 33 at the upper portion of the front side and abutting face 34 at the lower portion of the front side. Attachment/detachment directional moving section 32 holds holding plate 8N on the rear face upper portion of tape feeder 8 with holding face 33. When this occurs, abutting face 34 abuts the lower rear face portion of tape feeder 8. It is also possible to provide a connector on abutting face 34 and connect abutting face 34 to feeder control section 87 of tape feeder 8.

In order to supply power to attachment/detachment directional moving section 32, which moves, flexible power cable 35 is put in on the top side of attachment/detachment directional moving section 32. Power cable 35 is connected to power supply terminal 36 at an upper portion of attachment/detachment directional moving section 32.

Attachment/detachment direction driving devices 4 move the two attachment/detachment directional moving sections 32 independently in the attachment/detachment direction. Attachment/detachment direction driving device 4 is provided for each attachment/detachment directional moving section 32. Attachment/detachment direction driving device 4 includes upper rail 41, lower rail 42, driving motor 43, fixed pulley 44, drive belt 45, and the like. FIG. 3 shows attachment/detachment direction driving device 4 that drives attachment/detachment directional moving section 32 which is toward the back in the paper.

Upper rail 41 and lower rail 42 are provided on side plate 312 of case 31. Upper rail 41 and lower rail 42 are parallel to each other, while being vertically separated from each other, and extend in the attachment/detachment direction. Driving motor 43 is disposed at the rear of case 31. A deceleration mechanism is attached to an output shaft protruding from driving motor 43 toward the back side in the drawing. Fixed pulley 44 is disposed in the front portion of side plate 312. Annular drive belt 45 is horizontally bridged between the output section of the deceleration mechanism and fixed pulley 44, and is capable of rotating.

Attachment/detachment directional moving section 32 is installed on upper rail 41 and lower rail 42. Attachment/detachment directional moving section 32 is driven by rotation of drive belt 45 and moves the internal space of exchange section 3 in the attachment/detachment direction. Attachment/detachment direction driving device 4 moves tape feeder 8 together with attachment/detachment directional moving section 32 held by holding face 33. Naturally, attachment/detachment direction driving device 4 can also move attachment/detachment directional moving section 32 alone.

Figure 9:
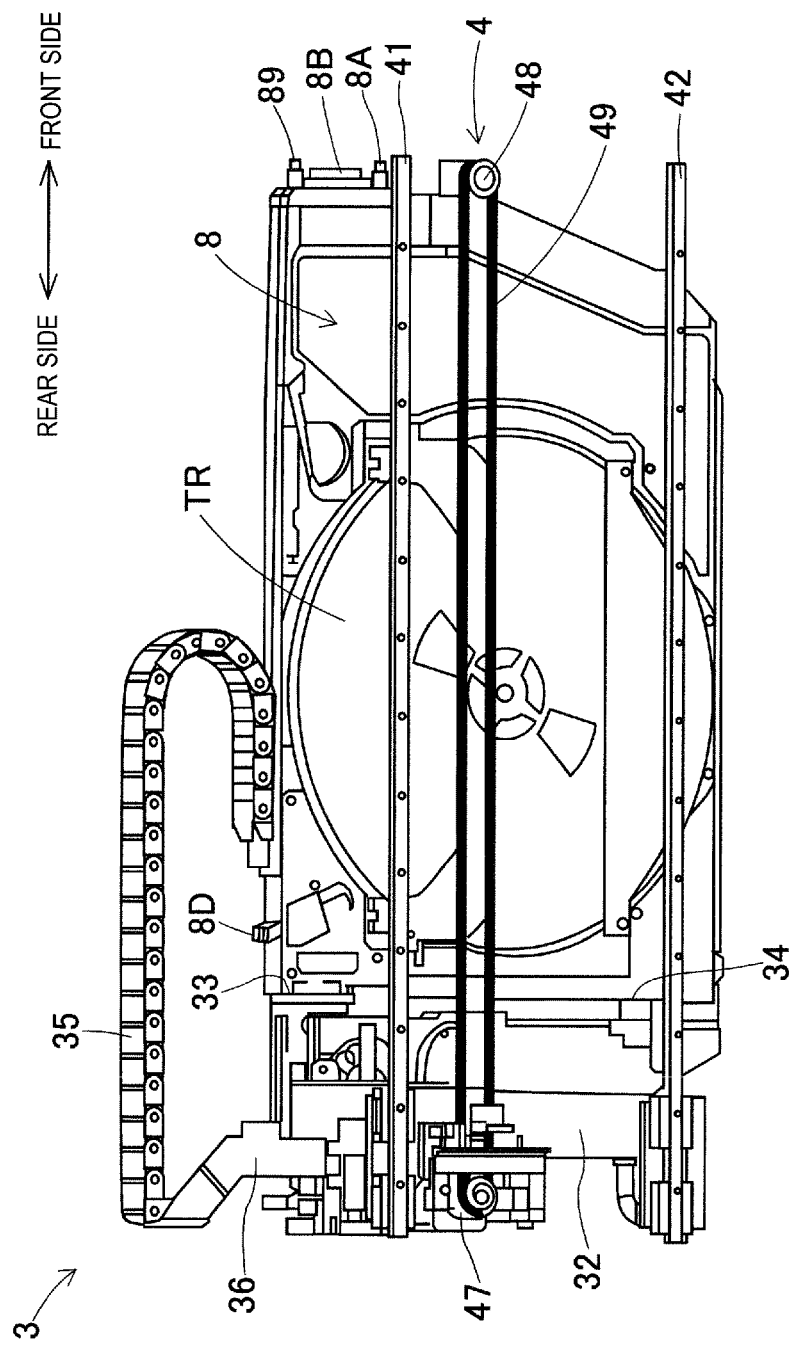
FIG. 9 is a perspective view showing a state in which the exchange section accommodates a tape feeder.

With respect to attachment/detachment direction driving device 4 that drives attachment/detachment directional moving section 32 on the front side of the drawing, the configuration itself is the same as that described above, but the arrangement positions of the members are different. That is, driving motor 47 is provided at a higher position than driving motor 43 in the reverse direction. In addition, as shown in FIG. 9, fixed pulley 48 and drive belt 49 which are provided on the side plate (not shown) in the front of the drawing are also arranged at correspondingly high positions. By arranging two attachment/detachment direction driving devices 4 in opposite directions at different heights in this manner, thinning of exchange section 3 and arrangement directional moving section 2 is made possible.

The internal configuration of attachment/detachment directional moving section 32 will be further described. Two sets of holding sections 5, release sections 6, shared driving sections 7, and control sections 79 are provided in each of two attachment/detachment directional moving sections 32. These two sets have the same configuration, are arranged side by side in the arrangement direction, and operate independently of each other. Hereinafter, the configuration of one set will be described in detail. Holding section 5, release section 6, shared driving section 7, and control section 79 are attached to main body section 37 which is a part of attachment/detachment directional moving section 32 and extends in the vertical direction.

Shared driving section 7 operates holding section 5 and release section 6. As shown in FIG. 3, shared driving section 7 includes stepping motor 71, first gear 73, second gear 76, and swing member 77. Stepping motor 71 is fixed to the lower portion of main body section 37. Stepping motor 71 switches between normal rotation and reverse rotation in accordance with instructions from control section 79, and rotates by the instructed rotation amount. The output shaft of stepping motor 71 is provided with output gear 72 having a small number of teeth.

First gear 73 is disposed above stepping motor 71 and supported by main body section 37 in a manner which allows rotation. First gear 73 is configured such that large gear 74 having a relatively large number of teeth and small gear 75 having a relatively small number of teeth are integrally superposed coaxially. In FIG. 4, small gear 75 is not visible being positioned behind large gear 74. Large gear 74 meshes with output gear 72.

Second gear 76 is disposed above first gear 73 and supported by main body section 37 in a manner which allows rotation. Second gear 76 has a larger number of teeth than small gear 75 and meshes with small gear 75. Swing member 77 is provided near the upper portion of second gear 76. Swing member 77 has swing pin 78 at a position outside the outer circumference of second gear 76. Output gear 72, first gear 73, and second gear 76 constitute the deceleration mechanism. With this configuration, the forward rotation and the reverse rotation of stepping motor 71 are converted into the swinging of swing pin 78 in the attachment/detachment direction.

Release section 6 is capable of releasing lock section 8C which prevents tape feeder 8 installed in component supply section 9A from becoming detached. Release section 6 includes direct operation member 61, manual lever 67, and the like. Direct operation member 61 is a rod-like member long in the attachment/detachment direction. Direct operation member 61 has long hole 62 which is long in the up-down direction at a substantially intermediate position in the longitudinal direction. Swing pin 78 is loosely fitted in long hole 62. Therefore, the swinging of swing pin 78 in a circular arc is directly converted into linear movement of direct operation member 61 in the attachment/detachment direction. Direct operation member 61 has, at the front end, release operation portion 63 for releasing lock section 8C.

Further, direct operation member 61 has intermediate driving pins 64 to the front and to the rear of long hole 62 such that long hole 62 is interposed in between the intermediate driving pins 64. The two intermediate driving pins 64 are loosely fitted into long holes 53 of slide plate 51, which will be described later. Thus, the horizontal state of direct operation member 61 is maintained. Further, direct operation member 61 has indirect driving protrusions 65 on the upper and lower side faces, between the front-side intermediate drive pin 64 and release operation portion 63. A pair of upper and lower indirect driving protrusions 65 drives chuck 55 of holding section 5, which will be described later.

Manual lever 67 is erected directly upward from the rear end of direct operation member 61. Manual lever 67 is operated in the attachment/detachment direction by the operator and enables manual operation of operation member 61 directly when shared driving section 7 malfunctions or the like. Position marker 68 is provided below manual lever 67. Position marker 68 operates integrally with direct operation member 61 to indicate the position of direct operation member 61. Main body section 37 is provided with reference position sensor 6A and holding position sensor 6B for detecting position marker 68.

FIG. 3 shows an initial state in which holding section 5 and release section 6 are not operating. Reference position sensor 6A detects position marker 68 at the rear end position of direct operation member 61 corresponding to the initial state. Holding position sensor 6B detects position marker 68 at the front end position of direct operation member 61 corresponding to the holding state when holding section 5 and release section 6 operate (refer to FIG. 5). Reference position sensor 6A and holding position sensor 6B output detection results to control section 79.

Holding section 5 is capable of holding tape feeder 8 which is targeted for exchange. The two holding sections 5 share holding face 33. Each holding section 5 includes slide plate 51, a pair of upper and lower chucks 55, and the like. Slide plate 51 is a substantially rectangular plate-like member, and has a trapezoidal cutout hole. Slide plate 51 is biased toward the front by a biasing spring (not shown). Swing member 77 swings in the cutout hole of slide plate 51. Four elongated slide holes 52 long in the attachment/detachment direction are formed in slide plate 51. Each of slide holes 52 is loosely fitted with support pin 38 erected on main body section 37. Two long holes 53 long in the attachment/detachment direction are formed in slide plate 51. Each of long holes 53 is loosely fitted with intermediate driving pin 64.

The dimensional allowance in the attachment/detachment direction of long hole 53 is larger than the dimensional allowance in the attachment/detachment direction of slide hole 52. When the dimensional allowance in the attachment/detachment direction of slide hole 52 and the dimensional allowance in the attachment/detachment direction of long hole 53 are added, direct operation member 61 matches the predetermined operation stroke length which operates in the attachment/detachment direction. In the initial state shown in FIG. 3, intermediate driving pin 64 is in contact with the rear edge of long hole 53 and prevents slide plate 51 biased toward the front from advancing. At this juncture, slide plate 51 is in a retracted position in which support pin 38 contacts the front edge of slide hole 52.

Chuck bearing seats 54 are provided at two points, near the front of slide plate 51, which are directly symmetrical in the up-down direction with respect to direct operation member 61. The pair of upper and lower chucks 55 are supported by chuck bearing seats 54 in a manner which allows swinging. The upper and lower pair of chucks 55 have parallel portions whose rear sides are substantially parallel to each other, proximal portions where the front sides of the parallel portions approach each other, and bent portions where the front sides of the proximate portions bend away from each other. Chuck 55 is supported around the boundary between the parallel portions and the proximal portions.

Indirect driving protrusions 65 of direct operation member 61 slide against oppositely facing surfaces of upper and lower chucks 55, respectively. In FIG. 3, indirect driving protrusions 65 slide against the tail ends of the parallel portions of chuck 55. At this juncture, the upper and lower pair of chucks 55 are in a closed state in which the proximal portions are in direct contact with direct operation member 61. While sandwiching release operation portion 63 of direct operation member 61, the bent portions of the pair of upper and lower chucks 55 are closed smaller than holding hole 8P of tape feeder 8.

Control section 79 is disposed below main body section 37. Control section 79 controls the rotation direction and the rotation amount of stepping motor 71 based on detection results from reference position sensor 6A and holding position sensor 6B. Since the rotation amount of stepping motor 71 is controllable, reference position sensor 6A and holding position sensor 6B are not essential. However, when the supply of power to exchange device 1 is stopped or when an operation is performed by manual lever 67, there is a possibility that the position of operation member 61 will not be known. Therefore, it is preferable to provide at least one of reference position sensor 6A and holding position sensor 6B.

Figure 5:
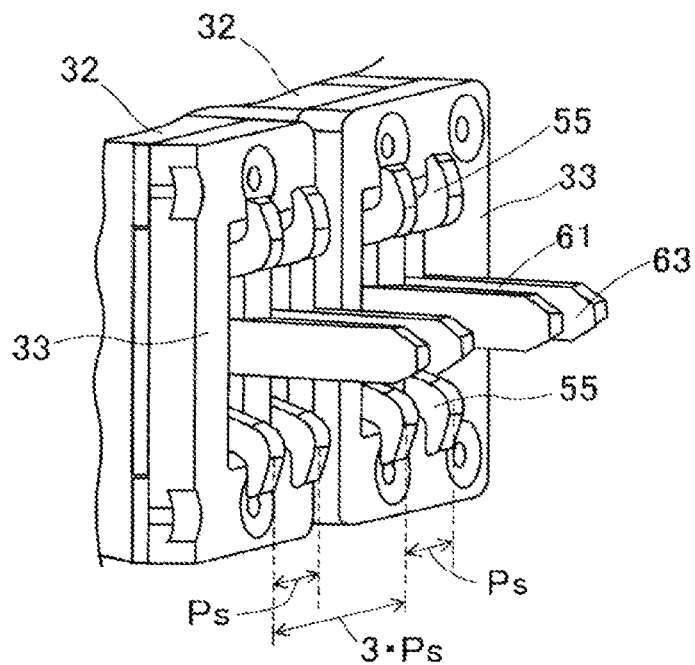
FIG. 5 is an enlarged perspective view of the vicinity of holding faces of two attachment/detachment directional moving sections arranged side by side.

Next, FIG. 5 is an enlarged perspective view of the vicinity of holding faces 33 of two attachment/detachment directional moving sections 32 arranged side by side. FIG. 5 shows a holding state in which holding section 5 and release section 6 operate. As will be described later in detail, the upper and lower pair of chucks 55 of holding section 5 protrude from holding face 33 and open to hold tape feeder 8. Further, release operation portion 63 at the tip of direct operation member 61 of release section 6 protrudes from holding face 33 and performs a release operation of lock section 8C of tape feeder 8.

As shown in the figure, the two attachment/detachment directional moving sections 32 are provided adjacent to each other in the arrangement direction at a pitch that is three times predetermined pitch Ps. The two attachment/detachment directional moving sections 32 may be provided adjacent to each other at a pitch twice predetermined pitch Ps or at a pitch of an integer multiple of four or more. Further, in each attachment/detachment directional moving section 32, two holding sections 5 are provided adjacent to each other in the arrangement direction at predetermined pitch Ps. The two holding sections 5 may be provided adjacent to each other at a pitch of an integer multiple of two or more of predetermined pitch Ps.

4. Holding Operation of Exchange Device 1 of the Embodiment

Figure 6:
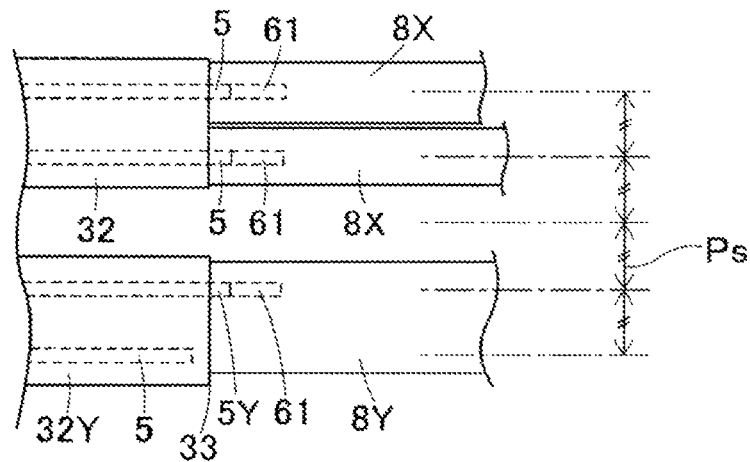
FIG. 6 is a plan view schematically showing a method for holding a standard tape feeder and a large tape feeder.

Here, a description will be given of the difference in the methods of holding multiple types of tape feeders (8X, 8Y, 8Z) having different widths among the operations of exchange device 1 of the embodiment. FIG. 6 is a plan view schematically showing a method for holding standard tape feeder 8X and large tape feeder 8Y. As shown in attachment/detachment directional moving section 32 on the upper portion of FIG. 6, each holding section 5 holds standard tape feeder 8X.

As shown on the lower portion of FIG. 6, large tape feeder 8Y faces the two holding sections (5Y, 5) in the arrangement direction. One holding section 5Y holds large tape feeder 8Y, and the other holding section 5 is kept in an initial state in which holding section 5 does not protrude from holding face 33. With this configuration, the other holding section 5 does not interfere with the holding large tape feeder 8Y.

Figure 7:
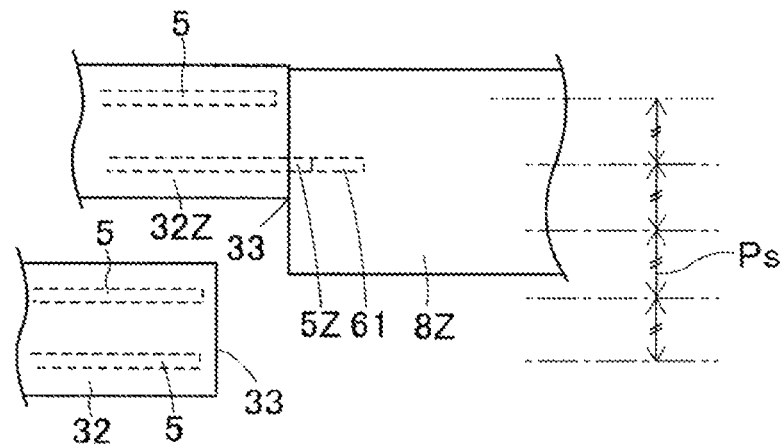
FIG. 7 is a plan view schematically showing a method for holding a very large tape feeder.

Next, FIG. 7 is a plan view schematically showing a method for holding very large tape feeder 8Z. As shown in the figure, very large tape feeder 8Z faces two attachment/detachment directional moving sections (32Z, 32) in the arrangement direction. One holding section 5Z of one attachment/detachment directional moving section 32Z in the upper portion of the drawing holds very large tape feeder 8Z, and the other holding section 5 is kept in an initial state in which holding section 5 does not protrude from holding face 33. In the other attachment/detachment directional moving section 32 in the lower portion of the drawing, two holding sections 5 are kept in the initial state. The other attachment/detachment directional moving section 32 is kept to the rear side than one attachment/detachment directional moving section 32Z in the attachment/detachment direction by attachment/detachment direction driving device 4. Normally, the second attachment/detachment directional moving section 32 remains at the rear end position in the attachment/detachment direction. With this configuration, when holding very large tape feeder 8Z, the other holding section 5 and the second attachment/detachment directional moving section 32 do not interfere with each other. As described above, holding section 5 can hold any size of tape feeder 8X, 8Y, 8Z.

Next, the holding operation in which exchange device 1 of the embodiment holds tape feeder 8 will be described in detail. The following description applies regardless of which one of feeder storage device 96, component supply section 9A, and spare feeder storage section 9B tape feeder 8 targeted for holding is in. First, arrangement direction driving device 20 moves arrangement directional moving section 2 to the front face of tape feeder 8 which is targeted for holding. Next, lifting/lowering driving section 26 adjusts the height of exchange section 3 in accordance with tape feeder 8. Next, attachment/detachment direction driving device 4 advances attachment/detachment directional moving section 32 facing tape feeder 8 in the attachment/detachment direction. Attachment/detachment directional moving section 32 advances until holding face 33 comes into contact with holding plate 8N of tape feeder 8. At this point, the state shown in FIG. 3 is reached.

As shown in FIG. 3, in the initial state, holding section 5 and release section 6 do not protrude from holding face 33 in the initial state in which they do not operate. Therefore, even if arrangement directional moving section 2 moves slightly in the arrangement direction and the position of attachment/detachment directional moving section 32 is finely adjusted, there is no risk of damage to tape feeder 8. If direct operation member 61 and chuck 55 protrude from holding face 33, it is necessary to retract attachment/detachment directional moving section 32 once before arrangement directional moving section 2 moves, causing the operation to become complicated and inefficient.

Next, control section 79 starts stepping motor 71. As a result, second gear 76 and swing member 77 start rotating clockwise in FIG. 3, and direct operation member 61 starts advancing in the attachment/detachment direction. As intermediate driving pins 64 of direct operation member 61 advance, slide plate 51 is also biased and starts to advance. Thereafter, slide plate 51 advances to an advanced position in which support pin 38 contacts the rear edge of slide hole 52. As a result, direct operation member 61 and chucks 55 in the closed state both protrude from holding face 33 and enter holding hole 8P.

When direct operation member 61 further advances after slide plate 51 stops at the advanced position, indirect driving protrusions 65 come close to the proximal portions of chucks 55. Thereafter, indirect driving protrusions 65 push and expand the proximal portions of the pair of upper and lower chucks 55 to open chucks 55. As shown in FIG. 8, the upper and lower pair of chucks 55 are then brought into a state in which the bent portions are opened and grip the inner face of holding plate 8N. FIG. 8 is a side view of attachment/detachment directional moving section 32 showing a holding state in which holding section 5 and release section 6 operate. Attachment/detachment directional moving section 32 holds tape feeder 8 using the pair of upper and lower chucks 55 of holding section 5. Note that there may be some backlash between chuck 55 and holding plate 8N in the holding state.

When direct operation member 61 finishes advancing the predetermined operation stroke length, release operation portion 63 pushes release arm 8J forward. As a result, lock section 8C shifts to the release state. Next, attachment/detachment direction driving device 4 retracts attachment/detachment directional moving section 32 holding tape feeder 8. At this juncture, tape feeder 8 slides while protruding strip 88 of the bottom face is guided by slot 314 of bottom plate 313 and is accommodated in the internal space of exchange section 3. FIG. 9 is a perspective view showing a state in which exchange section 3 accommodates tape feeder 8. In FIG. 9, case 31 constituting exchange section 3 is omitted. Alternatively, slot 314 of bottom plate 313 may be omitted from exchange section 3 and tape feeder 8 may be supported by holding section 5 only.

When accommodating tape feeder 8, the attachment/detachment directional moving section 32 horizontally pulls out tape feeder 8 in the attachment/detachment direction. The pulling-out force at this time acts on tape feeder 8 from chuck 55. Since chuck 55 is at the same height as connector 8B, connector 8B is pulled out straight. Therefore, the risk of damage to connector 8B is reduced. Similarly, upper positioning pin 89 and lower positioning pin 8A hardly exert a pulling-out force in an oblique direction, thereby reducing the risk of damage. In addition, it is sufficient to use a small amount of pulling-out force.

Thereafter, exchange section 3 is driven to the front face of any of feeder storage device 96, component supply section 9A, and spare feeder storage section 9B. Exchange section 3 can store or install accommodated tape feeder 8 in any of the slots. The storage operation and the installation operation of tape feeder 8 are performed in substantially reverse order of the holding operation described above.

5. Procedural Example of Exchange Operation of Exchange Device 1 of the Embodiment Next, a procedural example will be described of the exchange operation when exchange device 1 of the embodiment exchanges tape feeder 8 of component supply section 9A. Hereinafter, a procedure example when exchanging standard first tape feeder 8X1 and standard third tape feeder 8X3 provided adjacent to component supply section 9A with prepared second tape feeder 8X2 and prepared fourth tape feeder 8X4 will be described.

Figure 10:
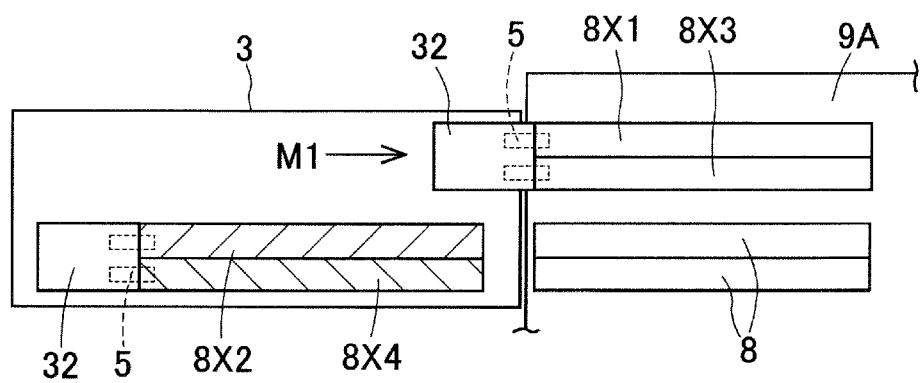
FIG. 10 is a plan view of the exchange section schematically showing a state immediately prior to the start of a collecting operation in a procedural example of an exchange operation.
Figure 11:
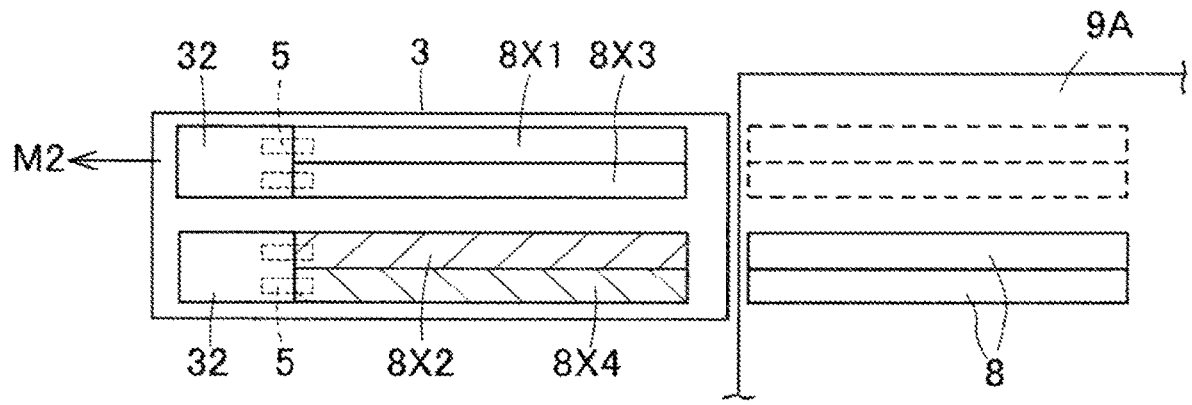
FIG. 11 is a plan view of the exchange section schematically showing a state in which the collecting operation is completed.
Figure 12:
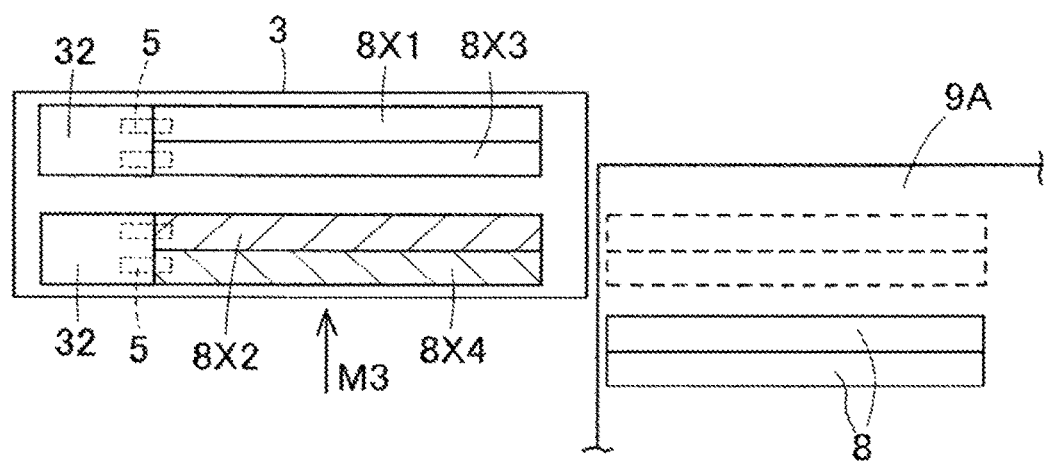
FIG. 12 is a plan view of the exchange section schematically showing a state immediately prior to starting equipment operation.
Figure 13:
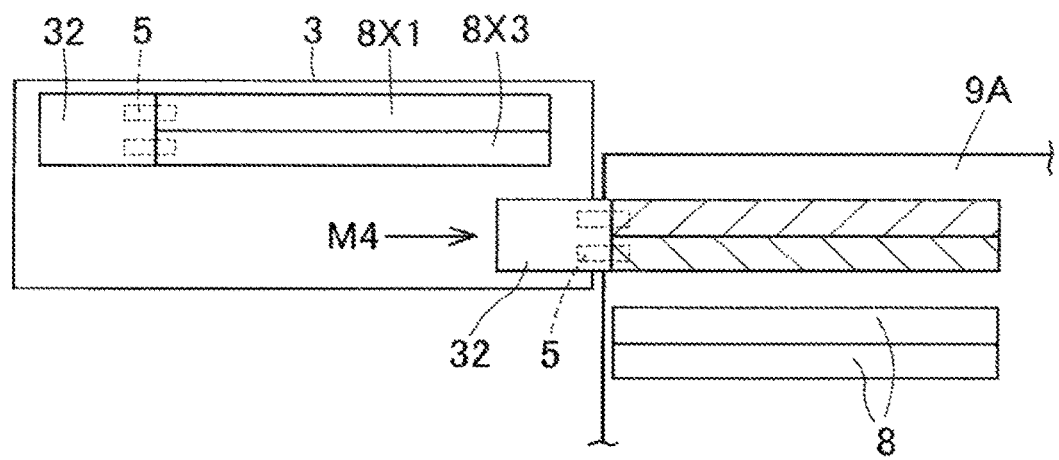
FIG. 13 is a plan view of the exchange section schematically showing a state in which the equipment operation is completed.

FIG. 10 is a plan view of exchange section 3 schematically showing a state immediately prior to the start of a collecting operation in a procedural example of an exchange operation. FIG. 11 is a plan view of the exchange section 3 schematically showing a state in which the collecting operation is completed. FIG. 12 is a plan view of exchange section 3 schematically showing a state immediately prior to starting equipment operation. FIG. 13 is a plan view of exchange section 3 schematically showing a state in which the equipment operation is completed. In FIGS. 10 to 13, second tape feeder 8X2 and fourth tape feeder 8X4 are shown hatched for convenience.

In exchange device 1, first, assume two holding sections 5 of a first attachment/detachment directional moving section 32 (upper portion of FIG. 10) do not hold tape feeder 8. Next, in exchange device 1, two holding sections 5 of a second attachment/detachment directional moving section 32 (lower portion of FIG. 10) hold second tape feeder 8X2 and fourth tape feeder 8X4 and accommodate the tape feeders in exchange section 3. Next, arrangement direction driving device 20 and lifting and lowering driving section 26 operate to bring the first attachment/detachment directional moving section 32 of exchange section 3 directly opposite to first tape feeder 8X1 and third tape feeder 8X3 of component supply section 9A.

Next, the first attachment/detachment directional moving section 32 is driven and advanced by attachment/detachment direction driving device 4 (see arrow M1 in FIG. 10). Next, in the first attachment/detachment directional moving section 32, shared common driving section 7 operates and two holding sections 5 hold first tape feeder 8X1 and third tape feeder 8X3, and assumes the state shown in FIG. 10. Next, the first attachment/detachment directional moving section 32 is driven and retracted by attachment/detachment direction driving device 4 (see arrow M2 in FIG. 11). As a result, as shown in FIG. 11, first tape feeder 8X1 and third tape feeder 8X3 are collected and accommodated in exchange section 3.

Next, arrangement directional moving section 2 moves in the arrangement direction by three times predetermined pitch Ps (see arrow M3 in FIG. 12). As shown in FIG. 12, a second attachment/detachment directional moving section 32 then faces the slots that have become empty. Next, the second attachment/detachment directional moving section 32 is driven and advanced by attachment/detachment direction driving device 4 (see arrow M4 in FIG. 13) and assumes the state shown in FIG. 13. Next, holding sections 5 of the second attachment/detachment directional moving section 32 release the holding of second tape feeder 8X2 and fourth tape feeder 8X4 in accordance with the operation of shared driving section 7 in the reverse direction. Release section 6 sets lock section 8C to the locked state. As a result, second tape feeder 8X2 and fourth tape feeder 8X4 become installed in component supply section 9A. Thereafter, the second attachment/detachment directional moving section 32 is driven and retracted by attachment/detachment direction driving device 4 and the exchange operation is completed.

Note that it is also possible to perform an exchange operation in which first tape feeder 8X1 is collected by either holding section 5 of the first attachment/detaching directional moving section 32, and second tape feeder 8X2 is installed by either holding section 5 of the second attachment/detachment directional moving section 32. Furthermore, a total of four holding sections 5 can be used to collect four tape feeders 8X together and install four tape feeders 8X together. Exchange device 1 can perform various other exchange operation methods.

Since exchange device 1 of the embodiment has multiple holding sections 5, multiple tape feeders (8, 8X, 8Y) can be handled simultaneously. With this configuration, exchange device 1 can efficiently perform exchange work at the time of component replenishment work when a component shortage occurs in the middle of a mounting operation, setup changing work when the type of a board to be produced is switched, and the like. Therefore, as compared with the conventional configuration having one holding section 5, the non-production time required for exchanging tape feeders (8, 8X, 8Y) is shortened, the percentage of production time of the component mounting devices (93, 94, 95) is increased, and the efficiency of board production is improved.

6. Applications and Modifications of the Embodiment

Exchange device 1 may include three or more attachment/detachment directional moving sections 32. In addition, three or more holding sections 5 may be provided in attachment/detachment directional moving section 32. Furthermore, the number and arrangement pitch of holding sections 5 may differ depending on attachment/detachment directional moving section 32. The arrangement pitch of holding section 5 need not be an integer multiple of arrangement pitch Ps of tape feeder 8. Although exchange device 1 of the embodiment has four holding sections 5, as shown in FIG. 14 and FIG. 15, it is also possible to reduce the number of holding section 5 to two and simplify exchange device 1.

Figure 14:
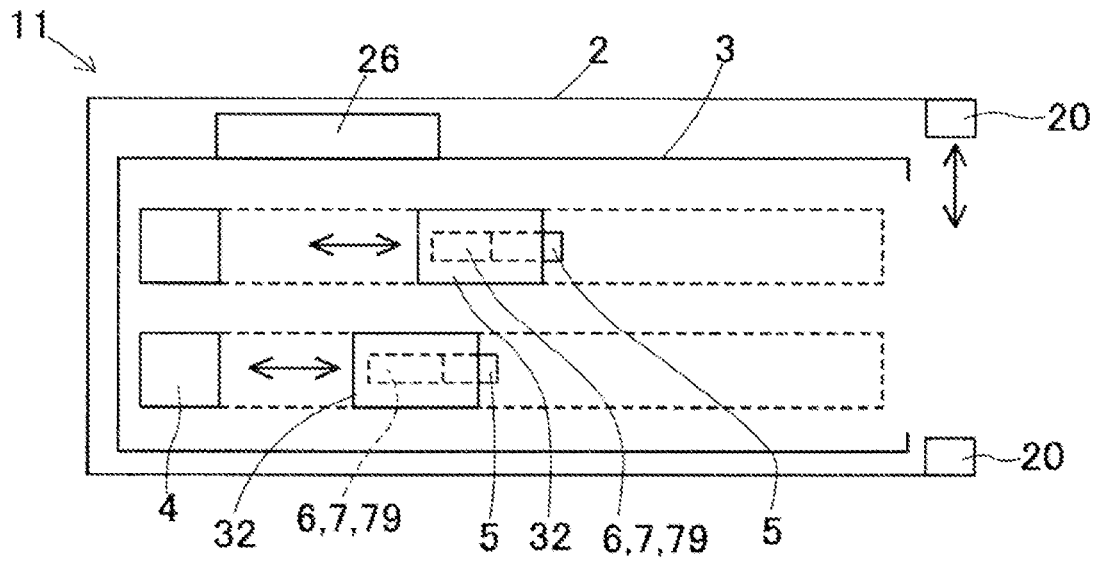
FIG. 14 is a view schematically showing an exchange device of a first application example in which the exchange device of the embodiment is simplified.

FIG. 14 is a view schematically showing exchange device 11 of a first application example in which exchange device 1 of the embodiment is simplified. In exchange device 11 of the first application example, one holding section 5 is provided in each of two attachment/detachment directional moving sections 32.

In exchange device 11 of the first application example, when exchanging first tape feeder 8X1 installed in component supply section 9A with prepared second tape feeder, a first attachment/detachment directional moving section 32 collects first tape feeder 8X1, and a second attachment/detachment directional moving section 32 installs second tape feeder 8X2. In addition, exchange device 11 can collect two tape feeders 8X together or install two tape feeders 8X together. Further, when exchanging large tape feeder 8Y, holding section 5 of the first attachment/detachment directional moving section 32 of exchange device 11 holds large tape feeder 8Y, and the second attachment/detachment directional moving section 32 is kept to the rear of the first attachment/detachment directional moving section 32 by attachment/detachment direction driving device 4.

Figure 15:
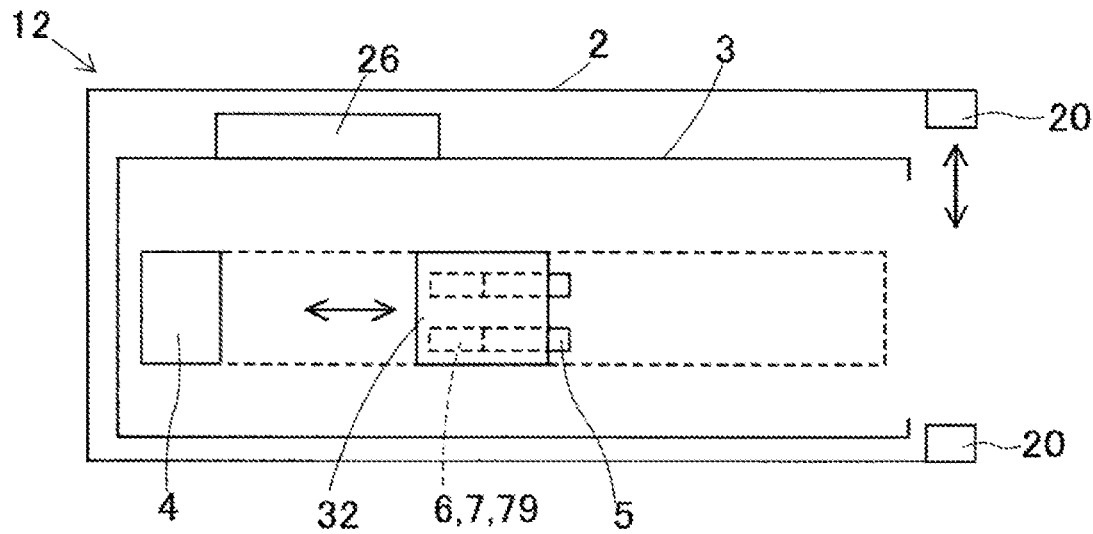
FIG. 15 is a view schematically showing an exchange device of a second application example in which the exchange device of the embodiment is simplified.

FIG. 15 is a view schematically showing exchange device 12 of a second application example in which exchange device 1 of the embodiment is simplified. In exchange device 12 of the second application example, two holding sections 5 are provided in one attachment/detachment directional moving section 32. In exchange device 12 of the second application example, in addition to an exchange operation in which first tape feeder 8X1 is collected by one holding section 5 and second tape feeder 8X2 is installed by another holding section 5, two tape feeders 8X can be collected together and two tape feeders 8X can be installed together. Further, when exchanging large tape feeder 8Y, one holding section 5 of exchange device 12 holds large tape feeder 8Y and the other holding section 5 is kept in an initial state.

Further, instead of chuck 55 which grips tape feeder 8 in holding section 5, a hook that hooks and pulls out tape feeder 8, an electromagnet that attracts tape feeder 8 by magnetic force, or the like may be used. As an exchange device not including lifting/lowering driving section 26, tape feeder 8 may be made to be exchanged only between component supplying section 9A and feeder storage device 96. Furthermore, tape feeder 8 may be configured so that tape reel TR can be taken out from the rear, and the exchange device (1, 11, 12) may be made to exchange only tape reel TR as an exchangeable element. Various other applications and modifications of the present embodiment are possible.

REFERENCE SIGNS LIST

1, 11, 12: Exchange device, 2: Arrangement directional moving section, 20: Arrangement direction driving device, 26: Lifting and lowering driving section, 3: Exchange section, 32, 32Y, 32Z: Attachment/detachment directional moving section, 33: Holding face, 4: Attachment/detachment direction driving device, 5, 5Y, 5Z: Holding section, 51: Slide plate, 55: Chuck, 6: Release section, 61: Direct operation member, 63: Release operation section, 64: Intermediate driving pin, 65: Indirect driving protrusion, 67: Manual operation lever, 6A: Reference position sensor, 6B: Holding position sensor, 7: Shared driving section, 71: Stepping motor, 73: First gear, 76: Second gear, 77: Swing member, 79: Control section, 8: Tape feeder, 8C: Lock section, 8X: Standard tape feeder, 8X1-8X4: First to fourth tape feeder, 8Y: Large tape feeder, 8Z: Very large tape feeder, 9: Component mounting system, 93: First component mounting device, 94: Second component mounting device, 95: Third component mounting device, 96: Feeder storage device, 9A: Component supply section, 9B: Spare feeder storage section, Ps: Predetermined pitch

The invention claimed is:

1. An exchange device configured to exchange an exchangeable element detachably installed in a component supply section of a component mounting device, the exchangeable element including a component container accommodating multiple components, the exchange device comprising:
    an arrangement directional moving section configured to move with respect to the component mounting device in an arrangement direction;
    multiple attachment/detachment directional moving sections provided in the arrangement directional moving section and configured to move independently of each other in an attachment/detachment direction of the exchangeable element;
    at least one holding section provided in each of the multiple attachment/detachment directional moving sections and configured to hold the exchangeable element;
    an arrangement direction driving device configured to move the arrangement directional moving section in the arrangement direction; and
    an attachment/detachment direction driving device configured to move multiple attachment/detachment directional moving sections, independently of each other, in the attachment/detachment direction.

2. The exchange device of claim 1, wherein
    multiple exchangeable elements are arranged in the arrangement direction at a predetermined pitch or at an integer multiple of the predetermined pitch; and
    the multiple attachment/detachment directional moving sections are arranged adjacent to each other in the arrangement direction at the predetermined pitch or at a pitch which is an integer multiple of the predetermined pitch.

3. The exchange device of claim 1, wherein, when exchanging a large exchangeable element facing the multiple attachment/detachment directional moving sections in the arrangement direction,
    the holding section of one of the attachment/detachment directional moving sections holds the large exchangeable element, and
    other attachment/detachment directional moving sections are kept to a rear side, in the attachment/detachment direction, than the one of the attachment/detachment directional moving sections by the attachment/detachment direction driving device.

4. The exchange device of claim 1, wherein, when exchanging a first exchangeable element installed in the component supply section with a second exchangeable element,
    one of the attachment/detachment directional moving sections collects the first exchangeable element, and
    another of the attachment/detachment directional moving sections installs the second exchangeable element.

5. The exchange device of claim 1, wherein multiple holding sections are provided in each of the multiple attachment/detachment directional moving sections.

6. The exchange device of claim 5, wherein
    multiple exchangeable elements are arranged in the arrangement direction at a predetermined pitch or at an integer multiple of the predetermined pitch;
    the multiple attachment/detachment directional moving sections are arranged adjacent to each other in the arrangement direction at a pitch which is an integer multiple of the predetermined pitch; and
    the multiple holding sections are arranged adjacent to each other in the arrangement direction at the predetermined pitch or at the integer multiple of the predetermined pitch.

7. The exchange device of claim 5, wherein,
    in each of the attachment/detachment directional moving sections, the multiple holding sections share a holding face in contact with the exchangeable element and do not protrude from the holding face in an initial state of non-operation; and,
    when exchanging a large exchangeable element facing the multiple holding sections in the arrangement direction, one of the holding sections holds the large exchangeable element and other holding sections are kept in the initial state.

8. The exchange device of claim 7, wherein, when exchanging a very large exchangeable element facing the multiple attachment/detachment directional moving sections in the arrangement direction,
    the one of the holding sections in one of the attachment/detachment directional moving sections holds the very large exchangeable element and the other holding sections are kept in the initial state; and
    other attachment/detachment directional moving sections are kept to a rear side, in the attachment/detachment direction, than the one of the attachment/detachment directional moving sections by the attachment/detachment direction driving device.

9. The exchange device of claim 5, wherein, when exchanging a first exchangeable element and a third exchangeable element installed in the component supply section with a second exchangeable element and a fourth exchangeable element,
    one of the attachment/detachment directional moving sections collects the first exchangeable element and the third exchangeable element, and
    another of the attachment/detachment directional moving sections installs the second exchangeable element and the fourth exchangeable element.

10. The exchange device of claim 1, wherein the exchangeable element is a component supply device, configured to supply the components, or the component container.

11. An exchange device configured to exchange an exchangeable element detachably installed in a component supply section of a component mounting device, the exchangeable element including a component container accommodating multiple components, the exchangeable element arranged in an arrangement direction at a predetermined pitch or an integer multiple of the predetermined pitch in the component supply section, the exchange device comprising:
    an arrangement directional moving section configured to move with respect to the component mounting device in the arrangement direction;
    an attachment/detachment directional moving section provided in the arrangement directional moving section and configured to move in an attachment/detachment direction of the exchangeable element;
    multiple holding sections provided adjacent to each other in the attachment/detachment directional moving section in the arrangement direction at the predetermined pitch or an integer multiple of the predetermined pitch and configured to hold the exchangeable element;

an arrangement direction driving device configured to move the arrangement directional moving section in the arrangement direction; and an attachment/detachment direction driving device configured to move the attachment/detachment directional moving section in the attachment/detachment direction.

12. The exchange device of claim 11, wherein the multiple holding sections share a holding face in contact with the exchangeable element and do not protrude from the holding face in an initial state of non-operation, and when exchanging a large exchangeable element facing the multiple holding sections in the arrangement direction, one holding section holds the large exchangeable element and the other holding sections are kept in the initial state.

* * * * *